United States Patent [19]
Ferrant

[11] Patent Number: 5,469,485
[45] Date of Patent: Nov. 21, 1995

[54] FREQUENCY DIVIDER

[75] Inventor: Richard Ferrant, St Ismier, France

[73] Assignee: Thomson-CSF Semiconducteurs Specifiques, Paris, France

[21] Appl. No.: 201,034

[22] Filed: Feb. 24, 1994

[30] Foreign Application Priority Data

Feb. 26, 1993 [FR] France ................................ 93 02231

[51] Int. Cl.⁶ .................................................... H03K 21/38
[52] U.S. Cl. .............................. 377/107; 377/116; 377/52
[58] Field of Search ................................ 377/107, 52, 81

[56] References Cited

U.S. PATENT DOCUMENTS

| | | | |
|---|---|---|---|
| 4,325,031 | 4/1982 | Ooms et al. | 377/107 |
| 4,612,658 | 9/1986 | Eby | 377/52 |
| 4,741,004 | 4/1988 | Kane | 377/52 |
| 4,891,827 | 1/1990 | Slater | 377/107 |

OTHER PUBLICATIONS

Patent Abstract of Japan, vol. 14, No. 463 (E–0988) Oct. 8, 1990 & JP-A-21 89 026, Jul. 25, 1990, Obo Ryosaku, "Detector For Overflow And Underflow Of Counter".

*Primary Examiner*—John S. Heyman
*Attorney, Agent, or Firm*—Oblon, Spivak, McClelland, Maier & Neustadt

[57] ABSTRACT

A frequency divider, constituted by N divide-by-two binaries, comprises logic circuits that enable the generation of a signal of the end of the frequency division by means of the change in state of the most significant bit generated by the Nth order divide-by-two binary. A binary code C representing a decimal integer value V is applied to the divider circuit. The frequency divider comprises circuits that enable the performance of a variable order division (V+1, V, ... V–p, where p is a whole number greater than or equal to 1 and smaller than N–1) for one and the same binary code C.

9 Claims, 6 Drawing Sheets

FREQUENCY DIVIDER

BACKGROUND OF THE INVENTION

The present invention relates to a frequency divider circuit.

Frequency divider circuits are used in numerous devices such as, for example, counting circuits, phase loops, frequency synthesizers or, again, information encryption circuits.

The invention shall be described more particularly with reference to the making of counting circuits but relates more generally to every field in which frequency dividers play a role.

There are two types of counting circuits. There are asynchronous counters and synchronous counters. The invention relates more particularly to synchronous counters but may also relate to asynchronous counters.

N-bit synchronous counters can generate $2^N$ different combinations.

Their resetting is done automatically when there is an overflow of capacity, i.e. at the $2^{Nth}$ clock stroke. It is then said that the frequency is divided by $2^N$.

It is often necessary to carry out a division by any number n before reaching the $2^{Nth}$ clock stroke. According to the prior art, the counting circuit then comprises additional logic functions that can be used to carry out a resetting operation at the desired point in time. Each code generated by the counter is compared with one and the same logic word. The comparison between the codes and the logic word gives a signal that permits the frequency division to the desired nth order. The comparison between the codes and the logic word necessitates the presence of a multiplexing circuit that very quickly becomes complex, once the number of bits N increases. This multiplexing circuit then takes up a great deal of space.

One drawback of the device according to the prior art is the fact that it requires a bulky circuit, the management of which is all the more complicated to manage as frequent changes have to be made in the value of n. This entails heavy penalties, for example in the case of phase loops where it is necessary, very frequently, to divide a reference frequency by a variable number n.

The present invention does not have this drawback.

SUMMARY OF THE INVENTION

An object of the present invention is a frequency divider constituted by a whole number N of dividers by 2, each divider by 2 enabling the generation of a bit $b_i$, wherein said divider comprises logic circuits enabling the generation of the signal of the end of the frequency division lo by means of the change in the state of the most significant bit generated by the Nth order divide-by-two binary.

An advantage of the invention, therefore, is that it simplifies the frequency division circuit and, therefore, the management of this circuit.

BRIEF DESCRIPTION OF THE DRAWINGS

Other features and advantages of the invention will appear from the description of a preferred embodiment, made with reference to the appended figures, of which.

In all these figures, the same reference numbers designate the same elements.

MORE DETAILED DESCRIPTION

Figure 1:
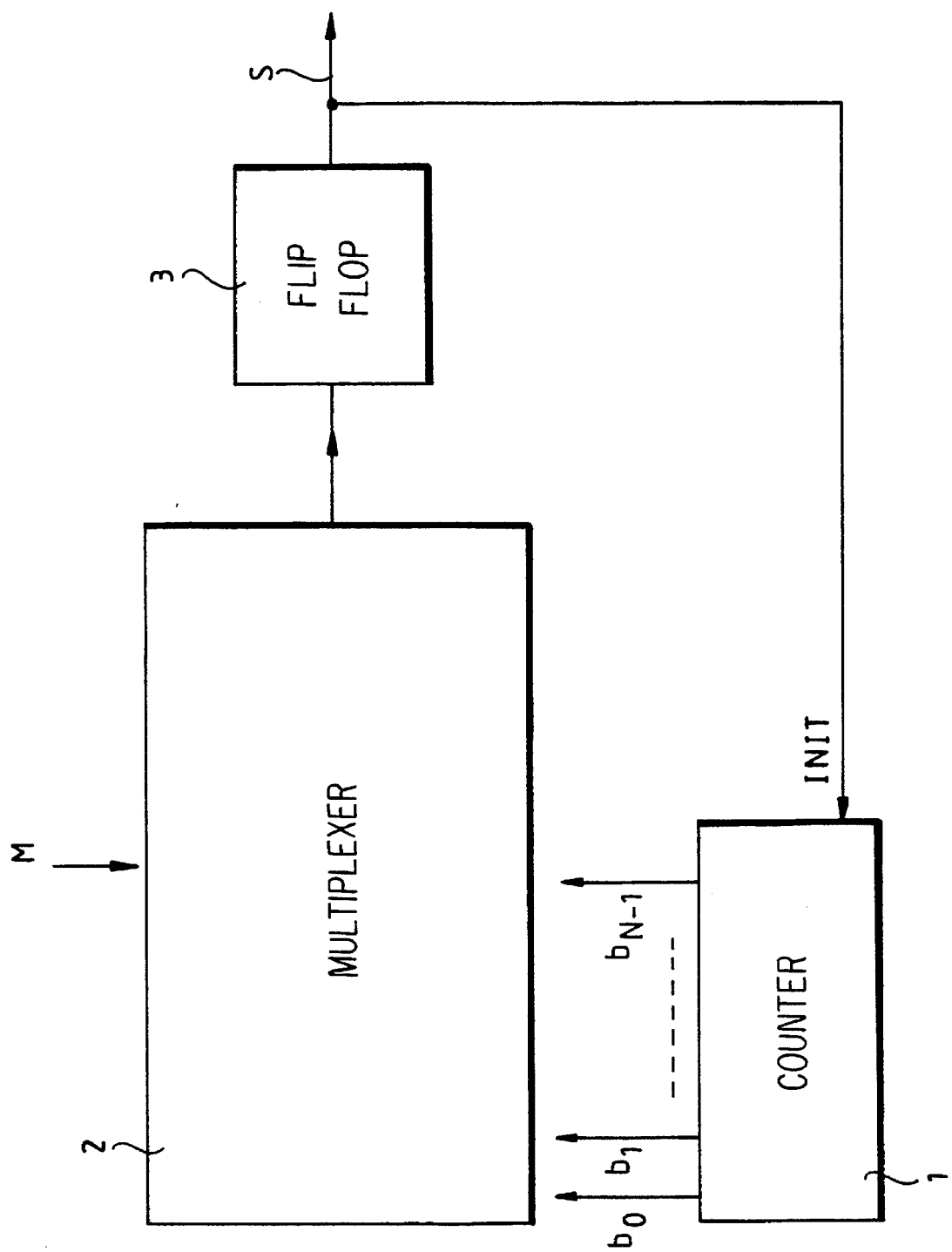
FIG. 1 shows the block diagram of a prior art counting circuit.

FIG. 1 shows a block diagram of a prior art counting device. The counter 1 generates an N bit binary code ($b_0$, $b_1$, ... $b_{N-1}$) under the effect of a clock signal that is not shown in the figure. The code ($b_0$, $b_1$, ... $b_{N-1}$) is sent to a multiplexing device 2 which furthermore receives a logic word M. This logic word represents the number n–1 in binary code, n being the number by which it is desired to divide the frequency. When the code ($b_0$, $b_1$, ... $b_{N-1}$) corresponds to the binary word M, the multiplexer 2 generates a signal that is sent to a flip-flop circuit 3.

At the nth clock stroke, the output signal S of the flip-flop circuit 3 is reinjected into the counter 1 in such a way as to constitute the signal INIT which enables the counter to be reset in its initial state.

As is known to those skilled in the art, the fact of identifying the code (n–1) and not n makes it possible to prevent any risk related to random factors.

As has been mentioned here above, a device such as this is very bulky because of the presence of both the multiplexer 2 and the flip-flop circuit 3. The invention does not have this degree of complexity.

Figure 2A:
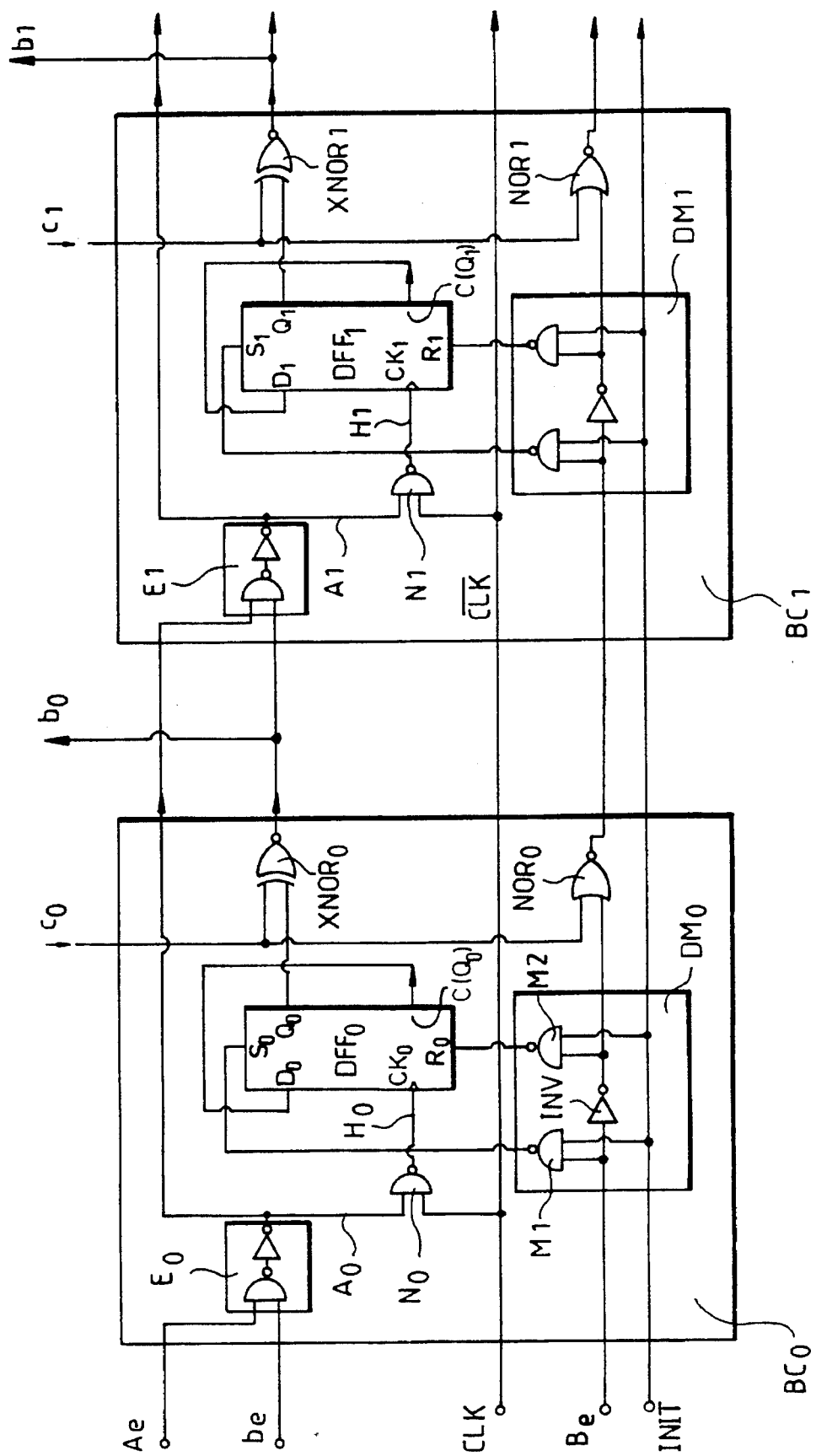
FIGS. 2A and 2B show a counting circuit according to a first embodiment of the invention.
Figure 2B:
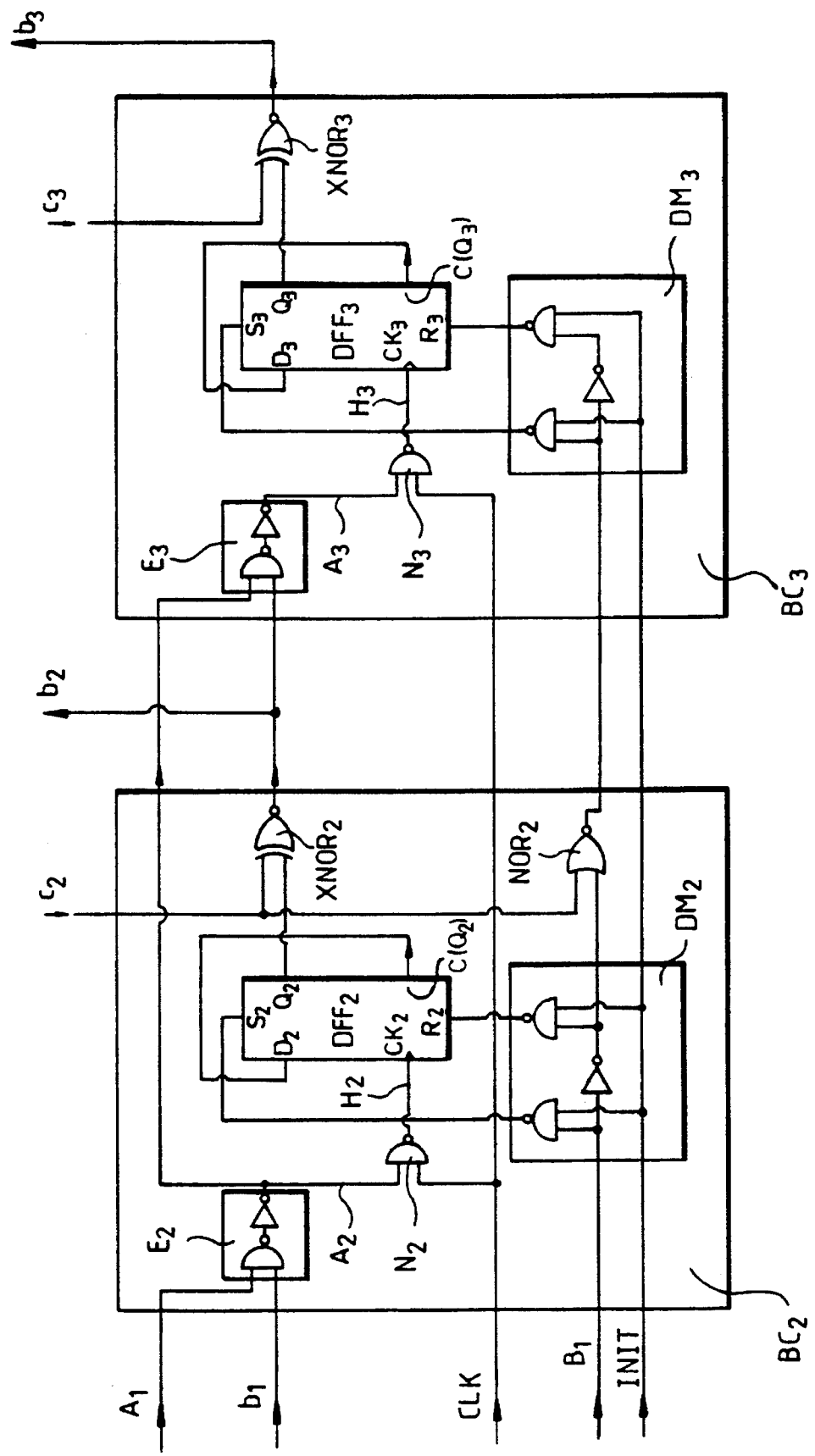

FIGS. 2A and 2B show a counting circuit according to a first embodiment of the invention.

For reasons of clarity, the same circuit has been shown on two different sheets. This circuit is a four-bit counter ($b_0$, $b_1$, $b_2$, $b_3$) but the invention also relates to N-bit counters where N is any whole number. It is for reasons of convenience that the chosen example corresponds to N=4.

The circuit shown in FIGS. 2A and 2B has four counting blocks $BC_0$, $BC_1$, $BC_2$, $BC_3$, each delivering one bit, i.e. respectively $b_0$, $b_1$, $b_2$, $b_3$. According to the invention, each bit $b_i$ comes from an exclusive-NOR circuit $XNOR_i$. Each circuit $XNOR_i$ has a first input connected to the output $Q_i$ of a divide-by-two binary, $DFF_i$, and a second input connected to a counting reference bit $C_i$.

We therefore get:

$$B_i = C_i \cdot Q_i + C(C_i) \cdot C(Q_i).$$

In the above equation, the symbols "·" and "+" represent the Boolean mathematical operations of multiplication and addition, and C(X) represents the variable whose value is the complementary logic level of the logic level of the variable X.

We therefore get:

$$b_i = Q_i \text{ for } C_i = 1.$$

and $$b_i = C(Q_i) \text{ for } C_i = 0$$

In FIGS. 2A and 2B, the divide-by-two binaries are D flip flops. However, the invention also relates to divide-by-two binaries constituted, for example, by J/K flip flops or RS flip flops.

Figure 4:
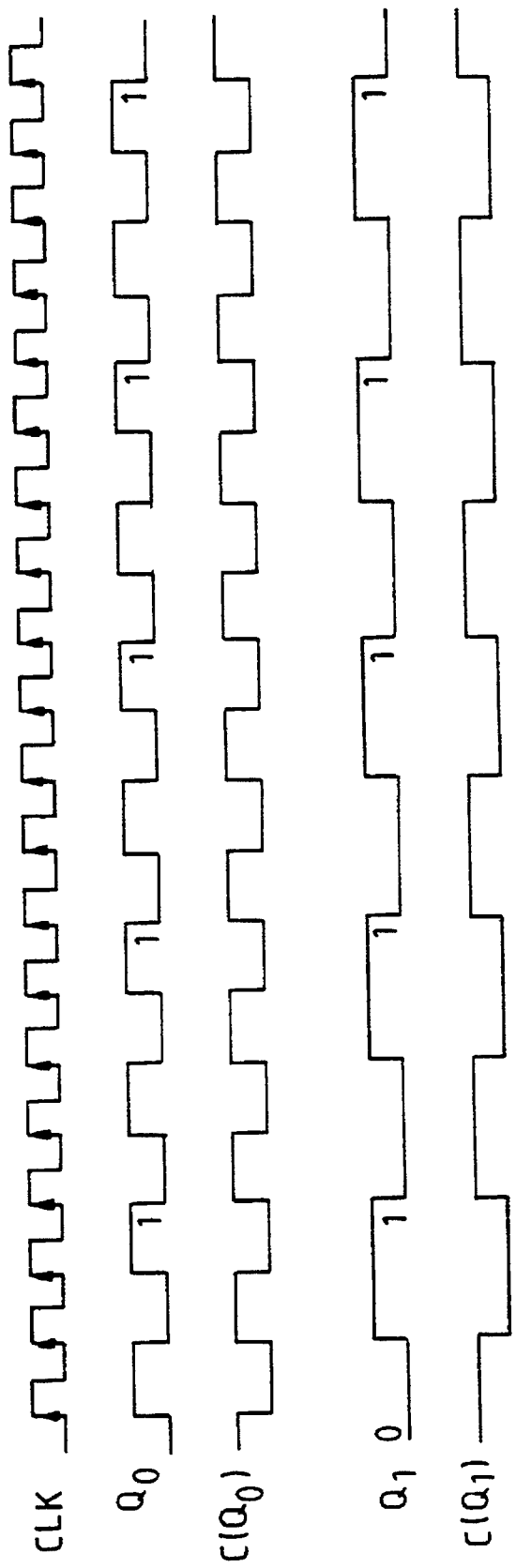
FIG. 4 shows the timing diagram of a counting circuit according to an exemplary embodiment of the invention.

According to the invention, the output $Q_i$ of each divider $DFF_i$ flips over, for example, on the leading edge of the clock signal Hi that is applied to its clock input $CK_i$, provided that all the bits $b_j$ (j=0, 1, . . . , i–1) coming from the preceding counting blocks are equal to 1 as shown in FIG. 4.

To this end, each clock signal Hi comes from a "NAND" logic circuit Ni to which there are applied, firstly, an external clock signal CLK and secondly a signal $A_i$ equal to 1 if and only if all the bits $b_j$(j=0, 1, . . . ,i–1) are equal to 1. The signal $A_i$ comes from an AND circuit Ei and has a value of $A_i = A_{i-1} \cdot b_{i-1}$. In order to initialize the device, two external signals $A_e$ and $b_e$, both equal to 1, are sent to the counting block $BC_0$.

For reasons of simplification, the logic circuits described are in negative logic mode which uses NAND circuits. However, the invention also relates to use of a positive logic. It is enough, then, to change the NAND functions into AND functions wherever necessary. The DFFi dividers then flip over at the trailing edge of the clock signal Hi.

Each divider DFFi comprises a set command Si and a reset command Ri.

The set and reset bits applied to each divider DFFi come from a demultiplexer DMi, which receives, firstly, the signal INIT that enables each counting block to be initialized and, secondly, a control signal $B_{i-1}$ that enables the signal INIT to be made active at the positions Si and Ri.

Each demultiplexer DMi is constituted by two NAND circuits M1 and M2, and an inverter circuit INV. A first NAND circuit, for example M1, has its output connected to the set position Si and a second NAND circuit, for example M1, has its output connected to the reset position $R_i$. Each NAND circuit has two inputs, of which one receives the signal INIT and the other receives either the control signal $B_{3-1}$ for M1 or a complementary signal of $B_{1-1}$ for M2.

The inverter INV makes it possible to send the signal INIT either towards Si or towards Ri.

Each counting block $BC_i$ also comprises a circuit $NOR_i$ that fulfils the NOR logic function and is designed to ascertain that the counting reference bit $C_i$ goes to 1. When the counting reference value bit $C_i$ goes to 1, the output of the circuit $NOR_i$ goes to zero, activating the reset active and hence inactivating the set of the i+1 order counting block. To this end, and generally, the output signal of the circuit $NOR_i$ constitutes the control signal $B_{i+1}$. The control signal sent to the demultiplexer $DM_o$ is an external signal referenced Be.

The combination of the counting reference bits $C_i$ constitutes a binary code C. This code represents a decimal integer value V encoded in binary mode. When the control bit Be is equal to 0, the set and reset bits applied to each divider DFFi are respectively equal to 1 and 0 when the initialization bit INIT goes to 1. All the outputs $Q_i$ are reset and the divider according to the invention carries out a division by V+1.

Figure 3A:
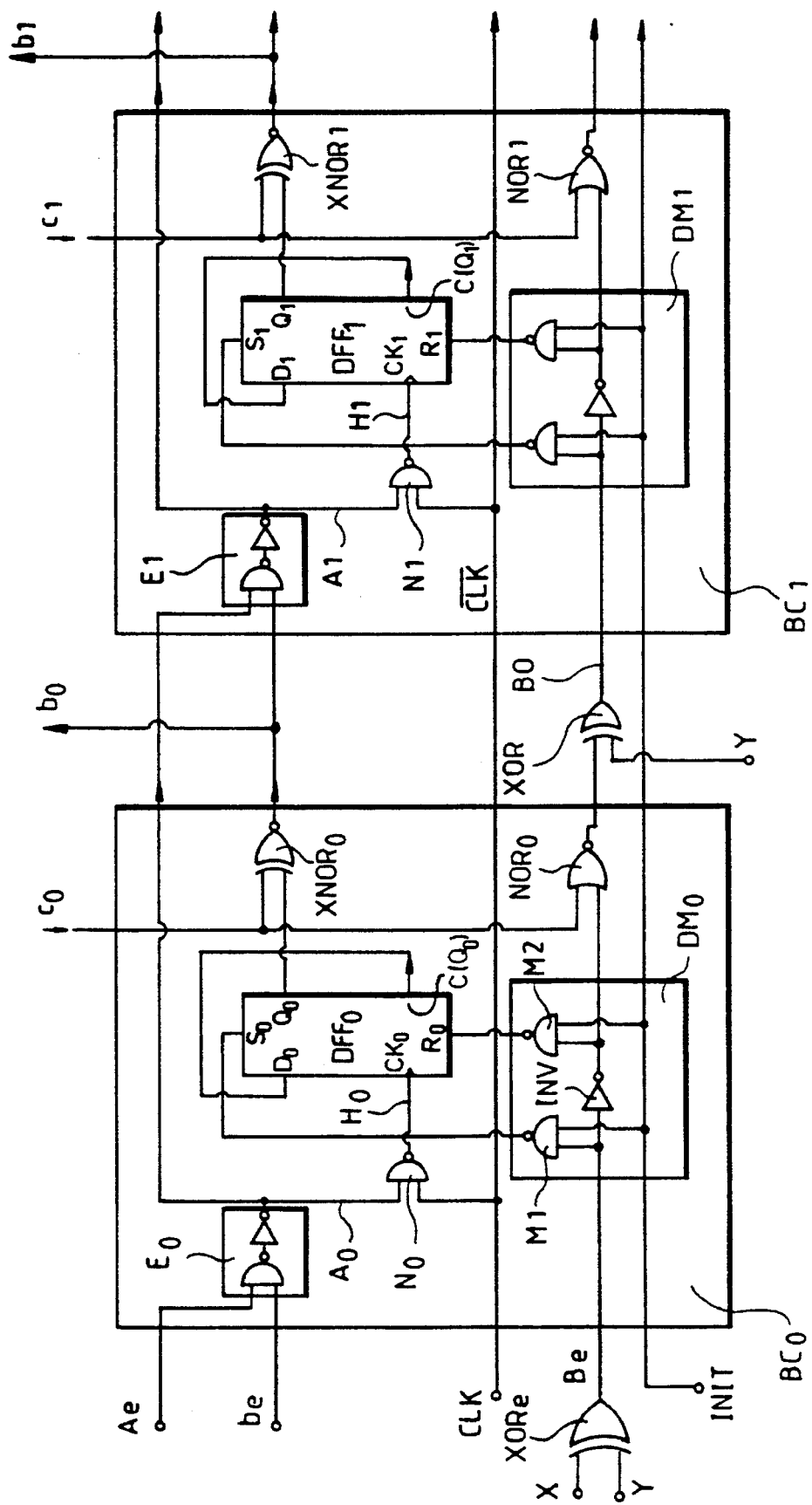
FIGS. 3A and 3B show a counting circuit according to a preferred embodiment of the invention.
Figure 3B:
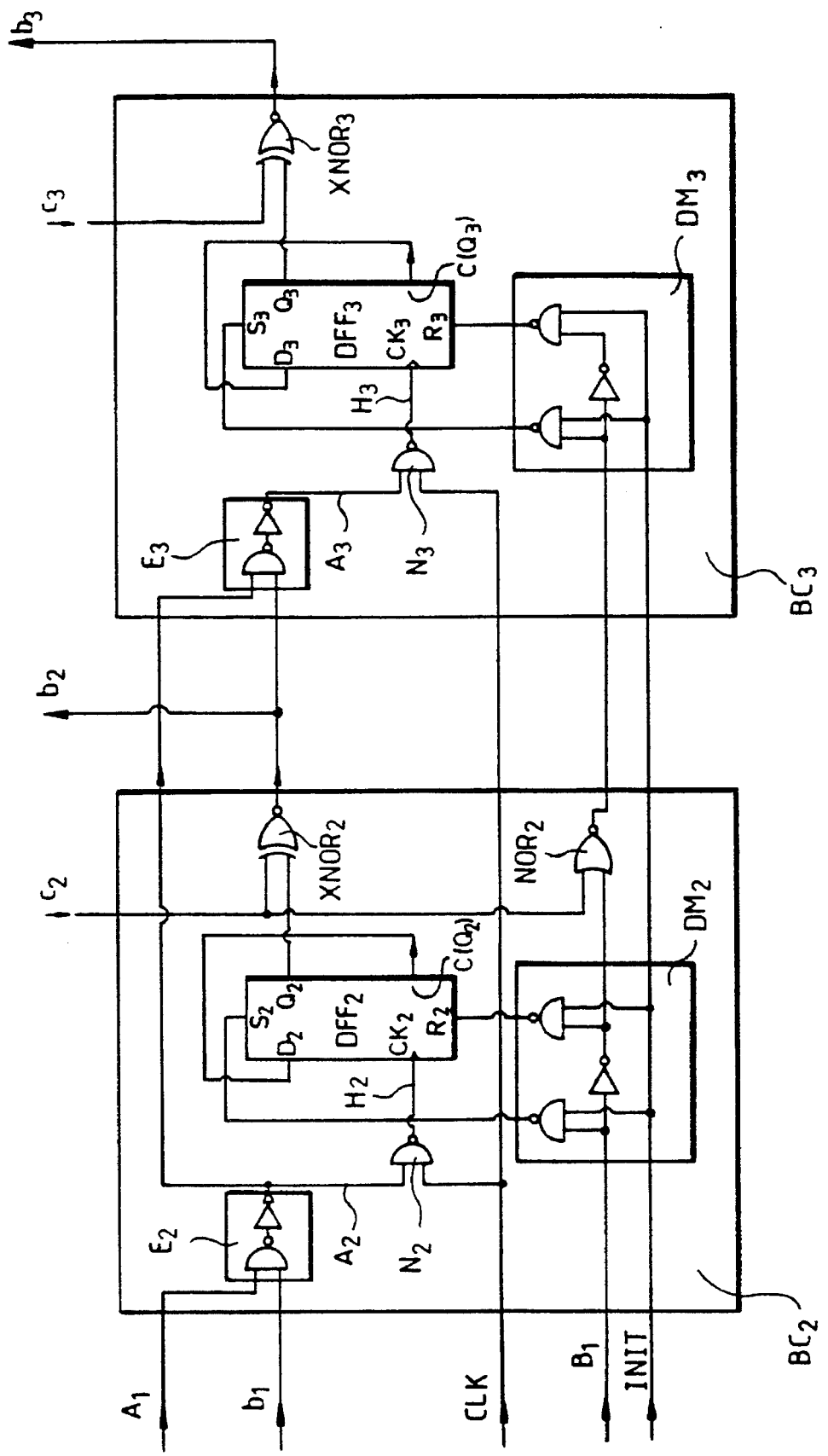

FIGS. 3A and 3B show a counting circuit according to the preferred embodiment of the invention. The device according to the preferred embodiment of the invention enables a division by V+1, V or V–1 according to the logic levels applied to the set and reset controls. To this end, two additional logic functions form part of the device.

A NOR logic function XORe generates the control signal Be from two control signals X and Y. We get: X, C(Y)+ C(X)·Y.

A second NOR logic function XOR generates the control signal $B_o$ firstly from the signal coming from the circuit $NOR_o$ and, secondly, from the control signal Y.

The conditions of a division by V+1 for X=0 and Y=0 are found again.

The following tables gives, as a function of the code C, the logic levels that are applied to the reset positions $R_i$ in order to obtain a division by V. The example chosen is that of the 4-bit counter.

| Code C | | | | Reset Logic | | | |
|---|---|---|---|---|---|---|---|
| C3 | C2 | C1 | C0 | R3 | R2 | R1 | R0 |
| 0 | 0 | 0 | 0 | 1 | 1 | 1 | 1 |
| 0 | 0 | 0 | 1 | 0 | 0 | 0 | 1 |
| 0 | 0 | 1 | 0 | 0 | 0 | 1 | 1 |
| 0 | 1 | 1 | 0 | 0 | 0 | 0 | 1 |
| 0 | 1 | 0 | 0 | 0 | 1 | 1 | 1 |
| 0 | 1 | 0 | 1 | 0 | 0 | 0 | 1 |
| 0 | 1 | 1 | 0 | 0 | 0 | 1 | 1 |
| 0 | 1 | 1 | 1 | 0 | 0 | 0 | 1 |
| 1 | 0 | 0 | 0 | 1 | 1 | 1 | 1 |
| 1 | 0 | 0 | 1 | 0 | 0 | 0 | 1 |
| 1 | 0 | 1 | 0 | 0 | 0 | 1 | 1 |
| 1 | 0 | 1 | 1 | 0 | 0 | 0 | 1 |
| 1 | 1 | 0 | 0 | 0 | 1 | 1 | 1 |
| 1 | 1 | 0 | 1 | 0 | 0 | 0 | 1 |
| 1 | 1 | 1 | 0 | 0 | 0 | 1 | 1 |
| 1 | 1 | 1 | 1 | 0 | 0 | 0 | 1 |

According to this operation, the output $Q_0$ is initialized at 1 so as to enable the output $Q_1$ to get switched over at the first clock stroke.

When all the bits of the code C are equal to 0, all the reset commands are at 1 and therefore all the set commands are at 0 on the different dividers DFFi. As soon as a counting reference value bit $C_i$ takes the value 1, the reset commands of the dividers having an order number greater than 1 are taken to zero.

Be must therefore be equal to 1 and Y must be equal to 0. We therefore get X=1 in this case.

The following tables gives, as a function of the code C, the logic levels that are applied to the reset positions $R_i$ in order to obtain a division by V–1. The example chosen is that of the 4-bit counter.

| Code C | | | | Reset Logic | | | |
|---|---|---|---|---|---|---|---|
| C3 | C2 | C1 | C0 | R3 | R2 | R1 | R0 |
| 0 | 0 | 0 | 0 | 1 | 1 | 1 | 0 |
| 0 | 0 | 0 | 1 | 1 | 1 | 1 | 0 |
| 0 | 0 | 1 | 0 | 0 | 0 | 1 | 0 |
| 0 | 0 | 1 | 1 | 0 | 0 | 1 | 0 |
| 0 | 1 | 0 | 0 | 0 | 1 | 1 | 0 |
| 0 | 1 | 0 | 1 | 0 | 1 | 1 | 0 |
| 0 | 1 | 1 | 0 | 0 | 0 | 1 | 0 |
| 0 | 1 | 1 | 1 | 0 | 0 | 1 | 0 |
| 1 | 0 | 0 | 0 | 1 | 1 | 1 | 0 |
| 1 | 0 | 0 | 1 | 1 | 1 | 1 | 0 |
| 1 | 0 | 1 | 0 | 0 | 0 | 1 | 0 |
| 1 | 0 | 1 | 1 | 0 | 0 | 1 | 0 |
| 1 | 1 | 0 | 0 | 0 | 1 | 1 | 0 |
| 1 | 1 | 0 | 1 | 0 | 1 | 1 | 0 |
| 1 | 1 | 1 | 0 | 0 | 0 | 1 | 0 |
| 1 | 1 | 1 | 1 | 0 | 0 | 1 | 0 |

According to this mode of operation, the first two counting blocks receive an initialization that is different from that of the other blocks.

For the first divider $DFF_0$, the reset command $R_0$ is equal to zero so as to impose the value 0 on $Q_0$. For the second divider $DFF_1$, the reset command $R_1$ is equal to 1 so as to impose the value 1 on $Q_1$.

The signals $B_e$, Y and X must also take the following values:

$B_e=0$; $Y=1$; $X=1$

As above, the reset commands for the dividers having a rank or order value greater than i are taken to zero when a counting reference value bit $C_i$ takes the value 1.

Whatever may be the mode of operation (division by V+1, V or V−1), the signal that permits the stopping of the counting is given by the changing of the state of the most significant bit $b_{N-1}$ generated by the counting block $BC_N$. The signal that indicates the end of the counting is therefore generated by the same bit, whatever may be the rank or order value of the division.

The invention therefore enables the elimination of the multiplexing logic which is necessary, according to the prior art, to recover the code indicating the end of counting. This multiplexing logic is very bulky. The gain in surface area that would result from its elimination is an advantage of the invention.

Another advantage of the invention is the elimination of the risk related to random factors since the signal that indicates the end of the counting is a single signal and appears with the intrinsic delay of the divider $DFF_N$.

The embodiment that has just been described is the preferred embodiment of the invention.

Advantageously, the presence of the circuits XOR and $XOR_e$ makes it possible, for one and the same code C, to vary the rank or order value of the frequency division. Indeed, depending on the control signals X and Y applied to the circuits XOR and $XOR_e$, the frequency division is a V+1, V or V−1 order frequency division.

The invention relates to other embodiments. According to these embodiments, circuits of the same type as the circuit XOR are added to X and Y applied to the circuits XOR and $XOR_e$, the frequency division is a V+1, V or V−1 order frequency division.

The invention relates to other embodiments. According to these embodiments, circuits of the same type as the circuit XOR are added to the device so as to enable, for one and the same code C, a V+1, V, ... or V−p order frequency division, p being a whole number ranging from 1 to N−1.

The flip-flop circuit 3, which is indispensable according to the prior art in order to prevent any risk related to random factors, is therefore no longer necessary in the device according to the invention.

The gain in space given by the device according to the invention enables the number of counting blocks to be increased substantially. Thus, a circuit according to the invention is capable, with an equivalent amount of space occupied, of generating a far greater number of bits than a circuit according to the prior art.

In particular, with regard to the phase loops, the very large number of orders of counting (ranging from two to several hundreds) give rise, according to the prior art, to a very great complexity of the logic circuits. The invention enables this complexity to be considerably reduced, thus enabling an extension of the field of action of the phase loops (which are circuits with a greater surface area and a larger number of modes of operation).

The invention relates to a variable-order counting circuit as has been described here above.

However, the invention also relates to a fixed-order counting circuit. The wiring logic is then simpler. The circuits $XNOR_i$ are eliminated so as to directly wire the outputs $Q_i$ or $C(Q_i)$ and the circuits of the set and reset logic are simplified so as to display only the useful control bits.

If the signal indicating the end of the frequency division operation is not reinjected at the INIT command, then the circuit according to the invention is no longer a frequency divider but a binary delay generator. The time limit is then equal to V+1, V or V−1 clock strokes. The invention also relates to this type of device.

Thus the resetting is done when the value V of the code C in decimals is equal to 3, giving:

C3=0 C2=0 C1=1 C0=1

We therefore get:

$b_0=C_0 \cdot Q_0 + C(C_0) \cdot C(Q_0) \rightarrow b_0 = Q_0$ $b_1=C_1 \cdot Q_1 + C(C_1) \cdot C(Q_1) \rightarrow b_1 = Q_1$ $b_2=C_2 \cdot Q_2 + C(C_2) \cdot C(Q_2) \rightarrow b_2 = C(Q_2)$ $b_3=C_3 \cdot Q_3 + C(C_3) \cdot C(Q_3) \rightarrow b_3 = C(Q_3)$ It is observed that, at the third clock stroke, all the bits $b_i$ (i=0, 1, 2, 3) are equal to 1 and all the bits $Q_i$ are reset at 1 at the fourth clock stroke.

What is claimed is:

1. A frequency divider including a whole number N of divide-by-two binaries, for generating an N-bit code $b_i$(i:0, 1,2, ... N−1) said divider including a plurality of logic means associated with each of said binaries for receiving a binary code representing a decimal integer value and outputting a frequency divided signal signifying a change in state of the most significant bit($b_{N-1}$) generated by the Nth divide-by-two binary, each of said logic means including:

a gate means for applying a controlled clock signal to an associated one of said binaries;

a first Exclusive gate means responsive to an output of an associated one of said binaries and to one bit of said binary code to provide an associated one bit of said N-bit code $b_i$;

a demultiplexer means receiving an initialization signal for controlling set and reset positions of an associated one of said binaries.

a coincidence logic gate responsive to said one bit of said binary code and a control bit to provide a further control bit to a subsequent demultiplexer.

2. A frequency divider according to claim 1, wherein said logic circuits are positive logic or negative logic circuits.

3. A frequency divider according to claim 1, wherein the divide-by-two binaries are D flip-flops, J/K flip-flops or RS flip-flops.

4. A frequency divider according to claim 2, wherein said logic means further includes means enabling each k order divide-by-two binary (where k equals 1,2, ... ,N) to flip over if and only if the bits output from all said first exclusive gate logic means below k ($b_0,b_1, ... ,b_{k-1}$)are equal to 1 in negative logic or to 0 in positive logic.

5. A frequency adder according to claim 2, wherein said gate means further includes a circuit for delivering a clock signal applied to a respective divide-by-two binary, said gate means receiving an external clock signal and a secondary signal equal to 1 in negative logic if and only if all the bits $b_j$ (j=0, 1, ... , i−1) are equal to 1 or equal to 0 in positive logic if and only if all the bits $b_j$ (j=0, 1, ... , i− 1) are equal to 0.

6. A frequency divider according to claim 5, further including a second exclusive gate logic means for modifying said control bit in order to enable, for one and the same said binary code, a variable order division (V+1, V, ... V−p, where p is a whole number greater than or equal to 1 and smaller than N–) under the action of external control signals.

7. A counting circuit containing a frequency divider according to any of the claims 1–6.

8. A phase loop containing a frequency divider according to any of the claims 1–6.

9. A frequency synthesizer containing a frequency divider according to any of the claims 1–6.

* * * * *